(12) United States Patent
Omura

(10) Patent No.: US 7,943,522 B2
(45) Date of Patent: May 17, 2011

(54) MANUFACTURING METHOD OF SEMICONDUCTOR DEVICE

(75) Inventor: Mitsuhiro Omura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/926,135

(22) Filed: Oct. 27, 2010

(65) Prior Publication Data

US 2011/0045615 A1   Feb. 24, 2011

Related U.S. Application Data

(62) Division of application No. 11/927,080, filed on Oct. 29, 2007, now Pat. No. 7,846,348.

(30) Foreign Application Priority Data

Oct. 30, 2006 (JP) ................................ 2006-294657

(51) Int. Cl.
*H01L 21/302* (2006.01)
*H01L 21/461* (2006.01)
(52) U.S. Cl. .......................... 438/711; 216/67; 438/716
(58) Field of Classification Search .................... 216/67; 438/711, 716
See application file for complete search history.

(56) References Cited

U.S. PATENT DOCUMENTS

| | | | |
|---|---|---|---|
| 5,756,400 A | 5/1998 | Ye et al. | |
| 6,136,211 A | 10/2000 | Qian et al. | |
| 2004/0097090 A1 | 5/2004 | Mimura et al. | |
| 2005/0022933 A1 | 2/2005 | Howard | |
| 2005/0241770 A1 | 11/2005 | Moriya et al. | |
| 2006/0000552 A1 | 1/2006 | Tanaka et al. | |
| 2006/0037703 A1 | 2/2006 | Koshiishi et al. | |
| 2007/0224826 A1* | 9/2007 | Delgadino et al. | 438/709 |

FOREIGN PATENT DOCUMENTS

JP    2006-19626    1/2006

* cited by examiner

*Primary Examiner* — Roberts Culbert
(74) *Attorney, Agent, or Firm* — Finnegan, Henderson, Farabow, Garrett & Dunner, L.L.P.

(57) ABSTRACT

A manufacturing method of a semiconductor device using a semiconductor manufacturing unit comprising a reaction chamber, a substrate mounting stage, and a high frequency power supply coupled to the substrate mounting stage, a blocking capacitor interposed between the substrate mounting stage and the high-frequency power supply to continuously perform a plurality of dry etching processing with respect to the same substrate in the same reaction chamber, the method includes: disposing a substrate on a substrate mounting stage, and applying high-frequency powers to the substrate mounting stage while introducing a fluorocarbon-based first gas to perform a first dry etching processing with respect to the substrate, the substrate including an organic material film and a silicon compound film sequentially deposited on a surface thereof and a resist film patterned on the silicon compound film, the first dry etching processing including processing the silicon compound film with the resist film being used as a mask; and stopping application of one of the high-frequency powers, thereby reducing a bias voltage generated to the substrate while introducing a second gas after the first dry etching processing to remove a fluorocarbon-based deposition in the reaction chamber and perform a second dry etching processing with respect to the substrate.

9 Claims, 14 Drawing Sheets

GAS: MIXED GAS HAVING RATIO OF $O_2$:$CHF_3 \fallingdotseq 20$:1
HIGH FREQUENCY: 2000 W IN CASE OF 100MHz ALONE

MANUFACTURING METHOD OF SEMICONDUCTOR DEVICE

This is a division of application Ser. No. 11/927,080, filed Oct. 29, 2007, now U.S. Pat. No. 7,846,348 which is incorporated herein by reference.

CROSS REFERENCE TO RELATED APPLICATION

This application claims benefit of priority under 35 USC §119 to Japanese patent application No. 2006-294657, filed on Oct. 30, 2006, the contents of which are incorporated by reference herein.

BACKGROUND OF THE INVENTION

1. Field of the Invention

The present invention relates to a manufacturing method of a semiconductor device.

2. Related Background Art

In recent semiconductor devices, structures thereof are extremely complicated to achieve miniaturization and an improvement in device performance, and the number of steps to manufacture the devices is thereby precipitously increased. Therefore, reducing the number of steps as much as possible to decrease a manufacturing cost is a very important problem in manufacture of semiconductor devices.

In miniaturization processing, especially a dry etching process, there is collective processing as a technique that is effective for a reduction in cost. According to this technique, processing that has conventionally been carried out in different reaction chambers at a plurality of steps is continuously performed in one reaction chamber. According to the collective processing, since a time required for loading/unloading with respect to the reaction chamber is simply reduced to ½ and a throughput of each unit with respect to this step is greatly improved, the number of units can be reduced, and a cost can be readily decreased.

On the other hand, when the collective processing is carried out in the dry etching process, a deposition film is formed on an inner wall of the reaction chamber due to a reactive gas used in previous processing. In the general dry etching process, cleaning processing of removing such a deposition film is appropriately carried out (see, e.g., Japanese Patent laid open (kokai) 2006-019626), but the processing advances to the next step without removing such a deposition in the collective processing. In such a case, substrate scraping or shoulder abrasion of a mask material occurs due to an effect of the deposition that has adhered to the inner wall of the reaction chamber, which becomes a factor of degrading device characteristics.

As explained above, continuously performing different types of processing as the collective processing in the dry etching process is very difficult.

SUMMARY OF THE INVENTION

According to a first aspect of the invention, there is provided a manufacturing method of a semiconductor device using a semiconductor manufacturing unit comprising a reaction chamber, a substrate mounting stage, a high frequency power supply coupled to the substrate mounting stage, a blocking capacitor interposed between the substrate mounting stage and the high-frequency power supply, and a temporary support member for a substrate to continuously perform a plurality of dry etching processing with respect to the same substrate in the same reaction chamber, the method comprising:

disposing a substrate on a substrate mounting stage, and applying high-frequency power to the substrate mounting stage, thereby generating a bias voltage to the substrate while introducing a fluorocarbon-based first gas to perform a first dry etching processing with respect to the substrate; and separating the substrate from the substrate mounting stage by using the temporary support member after the first dry etching processing, and applying the high-frequency power to the substrate mounting stage while introducing a second gas to remove a fluorocarbon-based deposition in the reaction chamber and perform a second dry etching processing with respect to the substrate.

According to a second aspect of the invention, there is provided a manufacturing method of a semiconductor device using a semiconductor manufacturing unit comprising a reaction chamber, a substrate mounting stage, and a high frequency power supply coupled to the substrate mounting stage, a blocking capacitor interposed between the substrate mounting stage and the high-frequency power supply to continuously perform a plurality of dry etching processing with respect to the same substrate in the same reaction chamber, the method comprising: disposing a substrate on a substrate mounting stage, and applying high-frequency powers to the substrate mounting stage while introducing a fluorocarbon-based first gas to perform a first dry etching processing with respect to the substrate, the substrate including an organic material film and a silicon compound film sequentially deposited on a surface thereof and a resist film patterned on the silicon compound film, the first dry etching processing including processing the silicon compound film with the resist film being used as a mask; and stopping application of one of the high-frequency powers, thereby reducing a bias voltage generated to the substrate while introducing a second gas after the first dry etching processing to remove a fluorocarbon-based deposition in the reaction chamber and perform a second dry etching processing with respect to the substrate.

DETAILED DESCRIPTION OF THE INVENTION

Figure 1:
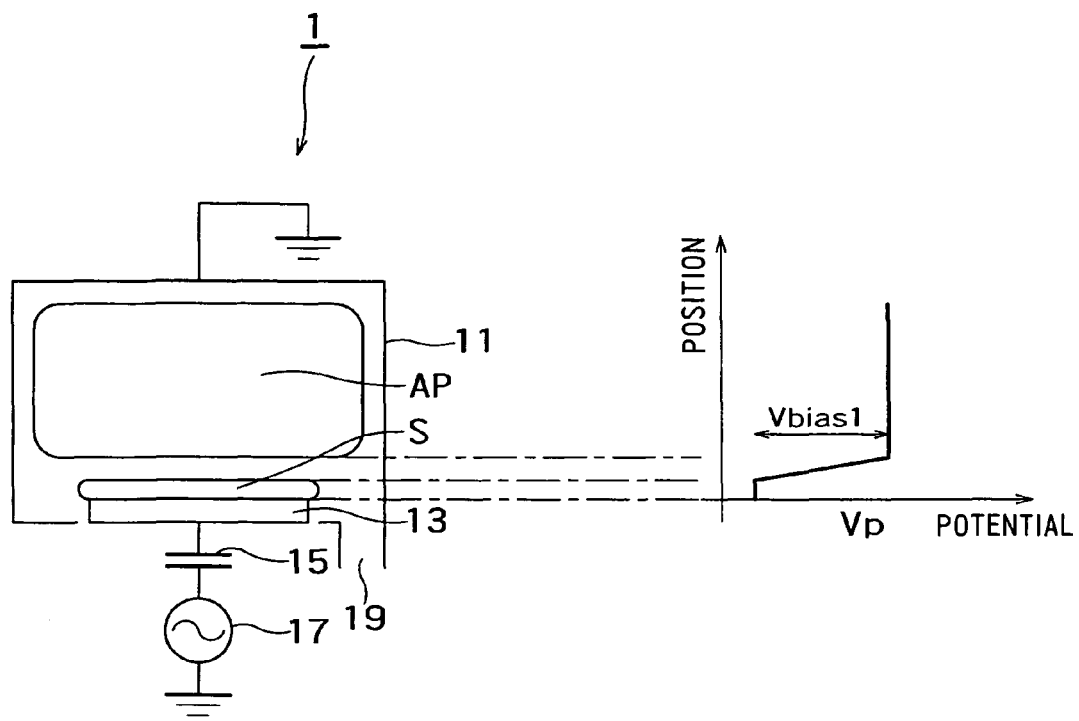
FIG. 1 is a schematic view showing a dry etching unit for use in a manufacturing method of a semiconductor device according to a first and a second embodiments of the present invention.

Several embodiments according to the present invention will now be explained hereinafter with reference to the drawings.

It is to be noted that like reference numerals denote like parts in the accompanying drawings and the following description, thereby appropriately omitting a tautological explanation thereof.

(1) Principle

Before describing each embodiment according to the present invention, the principle of each of the following embodiments will be explained hereinafter.

As an example of collective processing collective processing of continuously performing different types of processing in one reaction chamber can be realized by, in pre-processing, introducing a mixed gas containing, e.g., a fluorocarbon-based gas into a vacuum reaction chamber to generate a high-frequency plasma, using this plasma to perform anisotropic processing of a silicon oxide film, and then using an oxygen gas in subsequent processing to remove a resist alone that is an organic material film in the same reaction chamber. However, there may possibly occur a problem that a fluorocarbon-base deposition that has adhered to an inner wall of the reaction chamber in the pre-processing is etched by an oxygen plasma to produce a fluorocarbon-based gas and a silicon substrate is scraped in post-processing (which will be simply referred to as "scraping" hereinafter).

Further, as another example of collective processing, when characteristics that dry etching using an oxygen gas can process an organic material film but cannot process a coating type silicon oxide film are utilized, the coating type silicon oxide film can be used as a mask to continuously perform processing of the organic material film provided below this silicon oxide film in the same reaction chamber while changing a type of a gas.

However, in this case, a deposition on the inner wall of the reaction chamber is etched by dry etching using the oxygen gas, and a fluorocarbon-based gas is supplied, thereby scraping off the coating type silicon oxide film that should function as a mask. In particular, an effect of sputtering is also provided to form shoulder abrasion (which will be simply referred to as a "shoulder damage" hereinafter) at an end of a pattern and a dimension may possibly fluctuate.

Scraping of the silicon substrate or the silicon oxide film or the shoulder damage of the coating type silicon oxide film that becomes a factor of degrading device characteristics occurs because of coexistence of the following two elements.

1) The fluorocarbon-based gas is supplied into the plasma.

2) An ion is accelerated and pulled in toward a cathode side where the processing target substrate is present due to a self-bias.

Therefore, in order to avoid degradation in device characteristics, removing at least one of the factors 1) and 2) can suffice. However, when dry etching processing using the fluorocarbon-based gas is also performed, adherence of the fluorocarbon-based deposition to the inner wall of the processing chamber is unavoidable. In such a view point, a method of reducing a voltage that pulls in an ion that has produced in the processing target substrate is proposed in each of the following embodiments.

FIG. 1 is a schematic view of a dry etching unit for use in a manufacturing method of a semiconductor device according to a first and second embodiment of the present invention. A dry etching unit 1 depicted in FIG. 1 includes a vacuum reaction chamber 11, a substrate mounting stage 13, a blocking capacitor 15, a high-frequency power supply 17, and a gas exhaust opening 19.

The vacuum reaction chamber 11 is earthed as an anode. The substrate mounting stage 13 is electrically connected with the blocking capacitor 15, and a processing target substrate S is disposed on an upper surface of the substrate mounting stage 13. As will be explained in detail later with reference to FIG. 2, pusher pins 21 that lift up the processing target substrate S to be separated from the substrate mounting stage 13 are provided to the substrate mounting stage 13, and they are electrically insulated from the substrate mounting stage 13. In this embodiment, the pusher pin 21 corresponds to, e.g., a temporary support member. One end of the high-frequency power supply 17 is earthed, and the other end of the same is connected with the blocking capacitor 15. In this embodiment, the blocking capacitor 15 and the high-frequency power supply 17 correspond to, e.g., a bias voltage generator. The substrate mounting stage 13 is electrically connected as a cathode with the blocking capacitor 15 and the high-frequency power supply 17. Substantially all of an inner space of the vacuum reaction chamber 11 constitutes a plasma forming region AP.

For example, when a mixture obtained by mixing a fluorocarbon-based gas with an oxygen gas or a rare gas is introduced into the vacuum reaction chamber 11 via a gas introduction opening (not shown) to apply a high-frequency power to the substrate mounting stage 13, a high-frequency plasma is produced in the plasma forming region AP. A self-bias is generated in the processing target substrate S due to presence of the blocking capacitor 15, and an ion in the plasma is pulled into the processing target substrate S by utilizing this self-bias, thereby effecting anisotropic processing of a silicon oxide film or an organic material film. A graph on a right-hand side of FIG. 1 shows a potential difference Vbias 1 at which the ion is pulled in from the plasma. Here, Vp means a plasma potential.

Figure 2:
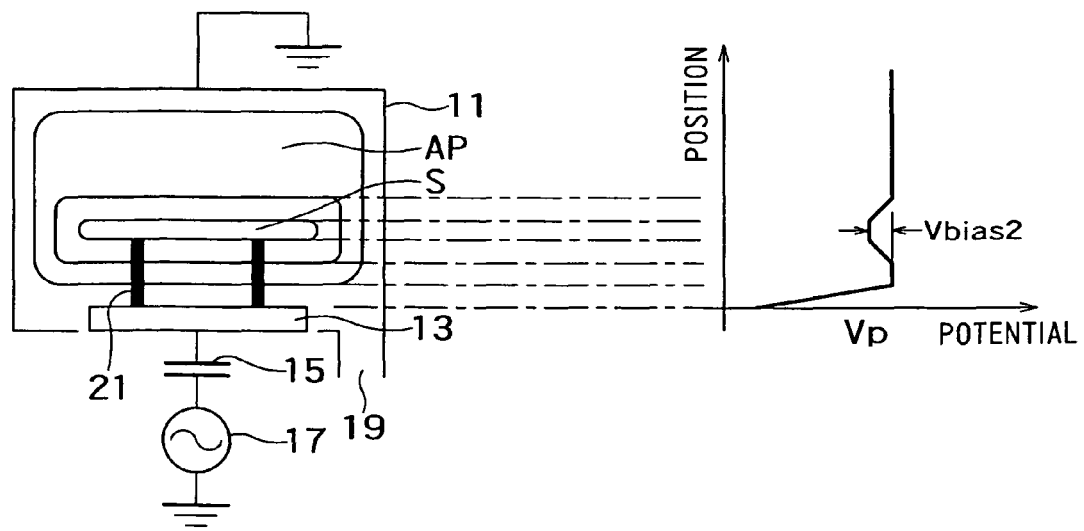
FIG. 2 is a view showing a state where a plasma is formed with a processing target substrate being lifted up from a substrate mounting stage by pusher pins.

FIG. 2 shows a state where the plasma is formed with the processing target substrate S being lifted up from the substrate mounting stage 13 by using the pusher pins 21. Here, covering a surface of each pusher pin 21 with an insulator enables the processing target substrate S to enter an electrically floating state. A graph on a right-hand side of FIG. 2 shows a potential difference Vbias 2 at which the processing target substrate S pulls in the ion. As apparent from comparison with the graph of FIG. 1, comparing magnitudes of absolute values of Vbias 2 and Vbias 1, |Vbias 2|<<|Vbias 1| is achieved, and it can be understood that acceleration of the ion can be reduced when the processing target substrate S is set in the floating state by using the pusher pins 21.

Therefore, when continuously performing a plurality of types of dry etching processing, even if a fluorocarbon-based deposition adheres to the inside of the reaction chamber due to preceding dry etching processing and a fluorocarbon-based component is supplied into the plasma from this deposition in subsequent dry etching processing, the ion is pulled into the processing target substrate S with a very low energy. As a result, scraping of the substrate or a mask material or a shoulder damage of the mask material can be greatly reduced.

Using the above-explained principle enables achieving the further stable collective processing.

(2) First Embodiment

A manufacturing method of a semiconductor device according to a first embodiment of the present invention will now be explained with reference to FIGS. 1 to 10. This embodiment provides a method of suppressing scraping of a silicon substrate or a silicon oxide film by applying the above-explained principle.

As a manufacturing unit, a dry etching unit 1 depicted in FIG. 1 is used. In this embodiment, 13.56 MHz is set as a frequency of a power supply 17.

Figure 3:
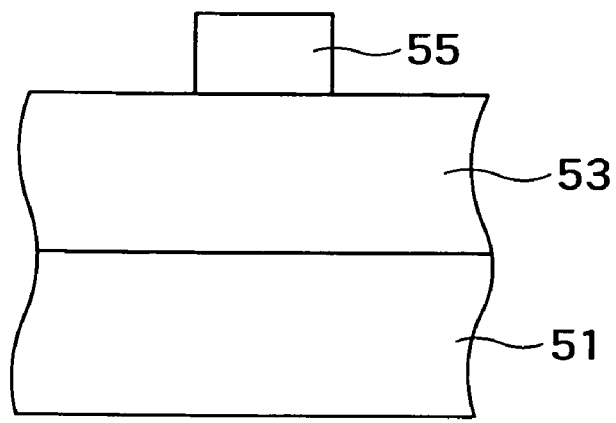
FIG. 3 is a view showing a cross-sectional structure of an example of the processing target substrate subjected to a manufacturing method of a semiconductor device according to a first embodiment of the present invention.

FIG. 3 shows a cross-sectional structure of a processing target substrate S1 in this embodiment. A silicon oxide film 53 is deposited on a silicon substrate 51 comprising a semiconductor device (not shown) formed on a surface layer, and a resist material 55 applied to this silicon oxide film 53 is patterned based on a lithography technology.

Figure 4:
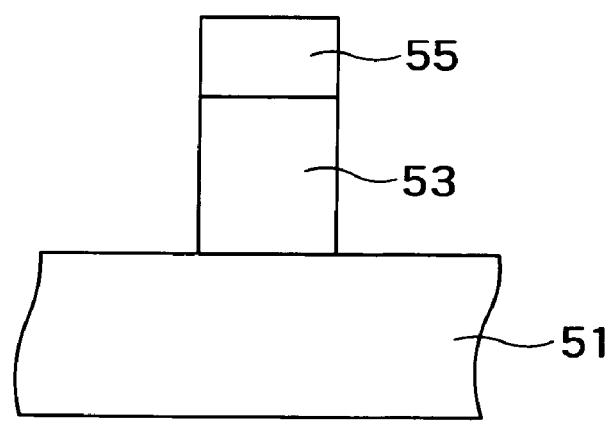
FIG. 4 is a view showing a state where a resist material is used as a mask material to process a silicon oxide film.
Figure 5:
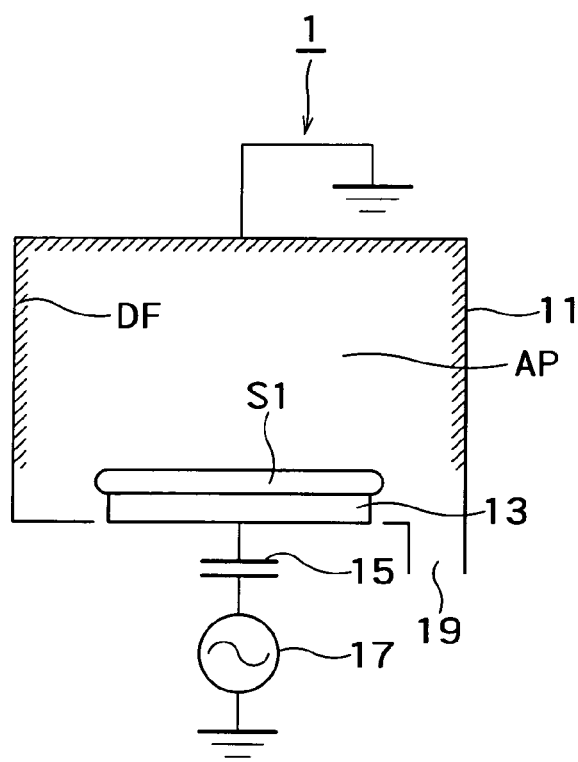
FIG. 5 is a view showing a state of a dry etching unit after a step of using the resist material as the mask material to process the silicon oxide film.

Here, a mixed gas containing, e.g., a methane trifluoride ($CHF_3$), oxygen ($O_2$), and argon (Ar) is introduced from an upper surface of a vacuum reaction chamber 11 of the dry etching unit 1 through a non-illustrated gas introduction opening, and a high-frequency power is applied to produce a high-frequency plasma in a plasma forming region AP, and an ion in the plasma is pulled into the processing target substrate S1 by utilizing a self-bias that occurs due to presence of a blocking capacitor 15. Consequently, as shown in FIG. 4, the resist material 55 is used as a mask material to process the silicon oxide film 53. The dry etching processing at the above-explained steps corresponds to, e.g., first dry etching processing in this embodiment. FIG. 5 shows a state of the dry etching unit 1 that has been through these steps. As shown in FIG. 5, a fluorocarbon-based deposition DF has adhered to an inner wall of the vacuum reaction chamber 11. In this embodiment, a mixed gas containing a methane trifluoride ($CHF_3$), oxygen ($O_2$) and argon (Ar) corresponds to, e.g., a first gas.

Figure 6:
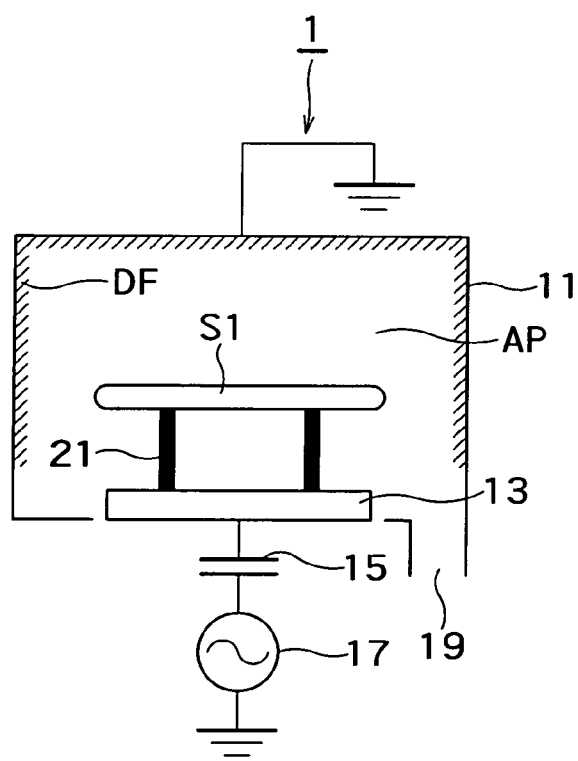
FIG. 6 is a view showing a step of lifting up the processing target substrate from the substrate mounting stage by the pusher pins and generating a plasma using a oxygen ($O_2$) gas to perform dry etching processing.
Figure 7:
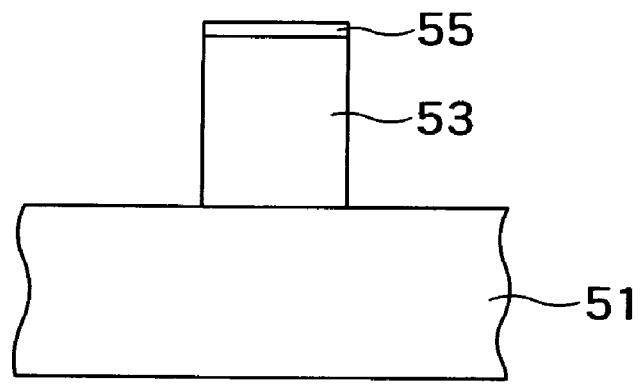
FIG. 7 is a view showing a cross-sectional structure of the processing target substrate subjected to dry etching processing at the step depicted in FIG. 6.
Figure 8:
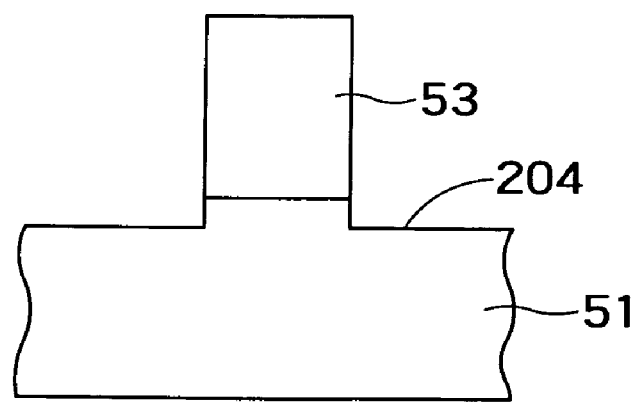
FIG. 8 is a view showing scraping that has occurred in a silicon substrate due to collective processing according to a conventional technology.

Then, as shown in FIG. 6, the pusher pins 21 are used to lift up the processing target substrate S1 from the substrate mounting stage 13, and the plasma using the oxygen ($O_2$) gas is generated. As a result, the deposition DF on the inner wall of the vacuum reaction chamber 11 is removed, and dry etching processing is carried out with respect to the processing target substrate S1. The dry etching processing at this step corresponds to, e.g., second dry etching processing in this embodiment. FIG. 7 shows a cross-sectional structure of the processing target substrate S1 obtained at this step. At this time, a potential difference that functions with respect to pulling the ion into the processing target substrate S1 is reduced based on the above-explained principle (see the respective graphs in FIGS. 1 and 2), and scraping (see reference numeral 204 in FIG. 8) of the silicon substrate 51 that occurs in, e.g., the conventional technology does not occur. Further, if all of a resist material 55 is removed and the silicon oxide film 53 below the resist material 55 is exposed, a surface of the silicon oxide film 53 is not scraped off.

Figure 9:
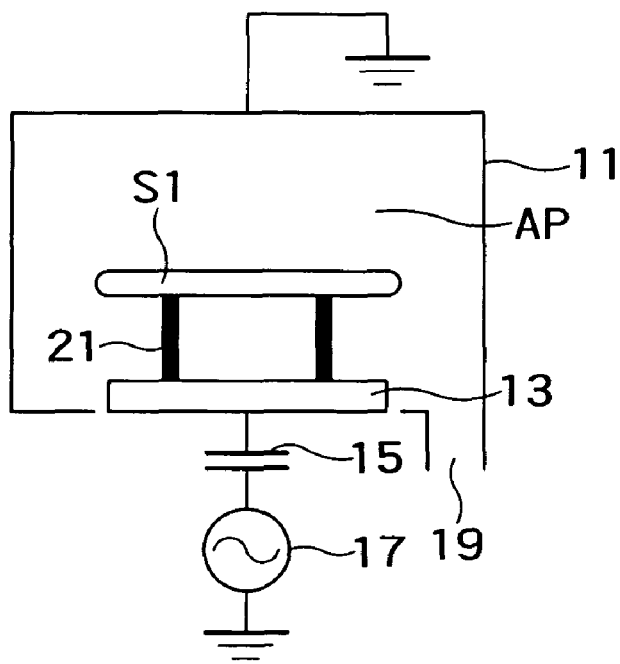
FIG. 9 is a view showing a step of continuing dry etching using the oxygen ($O_2$) gas while keeping the raised pusher pins to remove the resist material.
Figure 10:
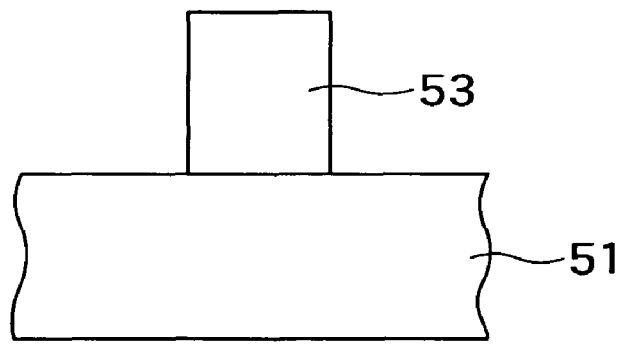
FIG. 10 is a view showing a state where dry etching using the oxygen ($O_2$) gas is continued to remove the resist material with the pusher pins being kept in a raised state or the pusher pins being set in an original position.

If the resist material 55 remains at a stage where the deposition DF on the inner wall of the vacuum reaction chamber 11 is removed as shown in, e.g., FIG. 7, dry etching using the oxygen ($O_2$) gas is continued while keeping the raised pusher pins 21 as shown in FIG. 9, thereby removing the resist material 55. Alternatively, the pusher pins 21 may be moved down to return the processing target substrate S1 to the substrate mounting stage 13 while considering the fact that the deposition DF on the inner wall of the vacuum reaction chamber 11 is removed, and the resist may be effectively removed in a state where a larger potential for pulling the ion into the processing target substrate S1 is produced. In this embodiment, the dry etching processing at this step corresponds to, e.g., third dry etching processing. The silicon substrate 51 is not scraped off as shown in FIG. 10 in both cases where the processing is continued while keeping the raised pusher pins 21 and where the pusher pins 21 are moved down and the resist is removed in a state where a larger potential difference is produced.

Although the oxygen ($O_2$) gas is used when removing the deposition DF on the inner wall of the vacuum reaction chamber 11 in this embodiment, any gas that can remove the fluorocarbon film can suffice. A hydrogen ($H_2$) gas, a nitrogen ($N_2$) gas, an ammonia ($NH_3$) gas, or a mixed gas containing these gases can be likewise used. In such a case, an effect of removing fluorine based on H—F or N—F binding is produced, further effective removal of the fluorocarbon film can be expected.

Furthermore, when the pusher pins 21 are moved down and the resist is continuously removed in a state where an original potential difference for pulling the ion into the processing target substrate S1 is generated after the deposition DF on the inner wall of the vacuum reaction chamber 11 is removed, changing a gas type or changing a plasma generation parameter is of course effective to increase the resist removal efficiency.

Moreover, it is further effective to adopt a multi-step process of changing a pressure in the reaction chamber from a first pressure to a lower second pressure before and after removing the deposition DF on the inner wall of the vacuum reaction chamber 11.

Specifically, when moving up the pusher pins 21 to remove the deposition DF on the inner wall of the vacuum reaction chamber 11, the plasma is generated by using a high pressure of, e.g., 100 mTorr to 1 Torr (corresponding to, e.g., the first pressure in this embodiment), a state where a bias for the processing target substrate S1 is lowered is attained to clean the inner wall, and an end point of removal of the deposition is detected from a change in plasma emission intensity, e.g., 226 nm or 484 nm based on C—O binding. Generation of the plasma is stopped to move down the pusher pins 21 when the end point is detected, then the plasma is again generated with a low pressure (corresponding to, e.g., the second pressure in this embodiment) of, e.g., 5 to 50 mTorr, and the resist is efficiently removed in a state where the bias for the processing target substrate S1 is increased.

Again describing particulars of the pusher pin 21, one having plasma resistance properties assured by coating a pusher pin main body formed of aluminum or SUS with ceramics, e.g., an aluminum oxide ($Al_2O_3$) or an yttrium oxide ($Y_2O_3$) is desirable.

Additionally, although the example where a parallel plate type dry etching unit of 13.56 MHz is used has been explained in this embodiment, the manufacturing method according to this embodiment can be applied to any unit as long as it is a dry etching unit that generates a self-bias by applying a high-frequency power from a cathode side to carry out processing, and a frequency of the high-frequency power to be applied, the number of power supplies, an application method, or a plasma generation scheme is not restricted at all.

(3) Second Embodiment

A second embodiment according to the present invention will now be explained with reference to FIGS. 11 to 19. In a manufacturing method according to this embodiment, a description will be given on use of the dry etching unit 1 depicted in FIG. 1. In this embodiment, 13.56 MHz is likewise set as a frequency of a power supply 17.

Figure 11:
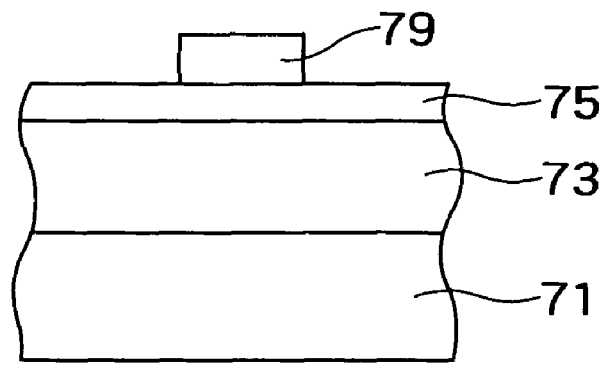
FIG. 11 is a view showing a cross-sectional structure of an example of a processing target substrate subjected to a manufacturing method of a semiconductor device according to a second embodiment of the present invention.

FIG. 11 shows a cross-sectional structure of a processing target substrate S3 in this embodiment. An organic material film 73 and a coating type silicon oxide film 75 (a Spin on Glass film) are deposited on a silicon substrate 71 comprising a semiconductor device (not shown) formed on a surface layer, and a resist material 79 applied to this silicon oxide film 75 is patterned based on a lithography technology. A structure in which the organic material film, the silicon compound film, and the patterned resist film are sequentially deposited on the substrate surface in this manner is called an "SMAP (Stacked Mask Process) structure".

Figure 12:
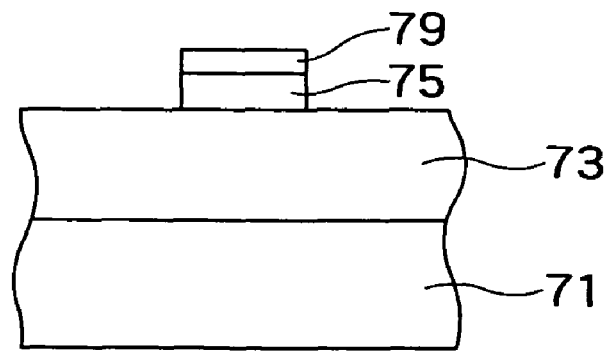
FIG. 12 is a view showing a state where a resist material is used as a mask material to process a coating type silicon oxide film.
Figure 13:
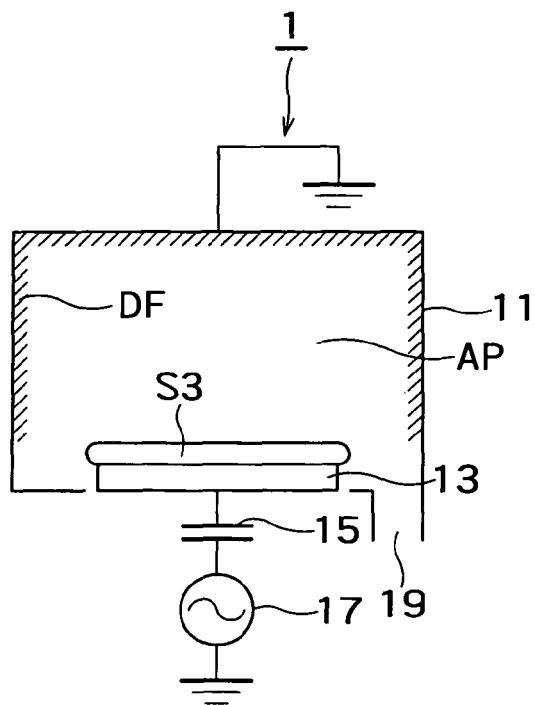
FIG. 13 is a view showing a state of a dry etching unit after the step of using the resist material as the mask material to process the coating type silicon oxide film.

Here, like the first embodiment, a mixed gas containing, e.g., a methane trifluoride ($CHF_3$), oxygen ($O_2$), and argon (Ar) is introduced from an upper surface of a vacuum reaction chamber 11 of the dry etching unit 1 through a non-illustrated gas introduction opening, a high-frequency power is applied to generate a high-frequency plasma in a plasma forming region AP, and a self-bias that is produced due to presence of a blocking capacitor 15 is utilized to pull an ion in the plasma into the processing target substrate S3. Consequently, as shown in FIG. 12, the resist material 79 is used as a mask material to process the coating type silicon oxide film 75. The dry etching processing at the above-explained step corresponds to, e.g., first dry etching processing in this embodiment. FIG. 13 shows a state of the dry etching unit 1 that has been through this step. As shown in FIG. 13, a fluorocarbon-based deposition DF has adhered to an inner wall of the vacuum reaction chamber 11. In this embodiment, a mixed gas containing a methane trifluoride ($CHF_3$), oxygen ($O_2$) and argon (Ar) corresponds to, e.g., a first gas.

Figure 14:
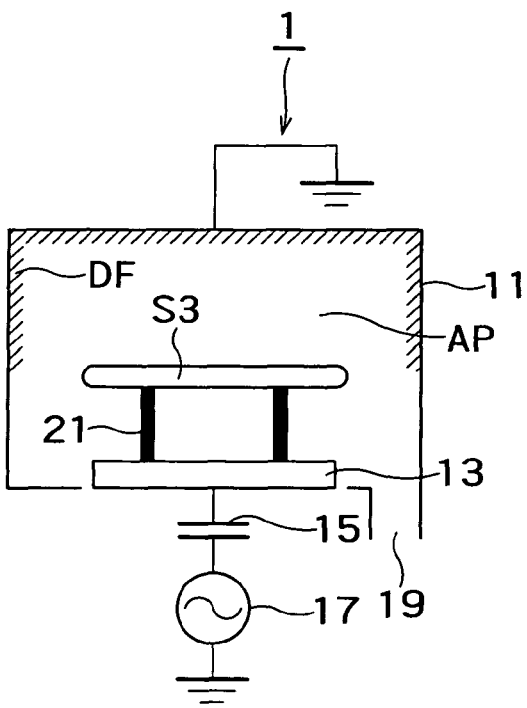
FIG. 14 is a view showing a step of lifting up the processing target substrate from a substrate mounting stage by pusher pins and generating a plasma using an oxygen ($O_2$) gas to perform dry etching processing.
Figure 15:
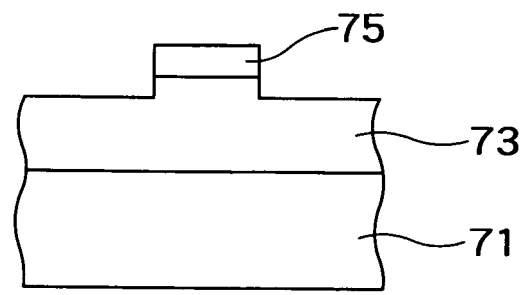
FIG. 15 is a view showing a state where the resist material of the processing target substrate is removed at the step depicted in FIG. 14.
Figure 16:
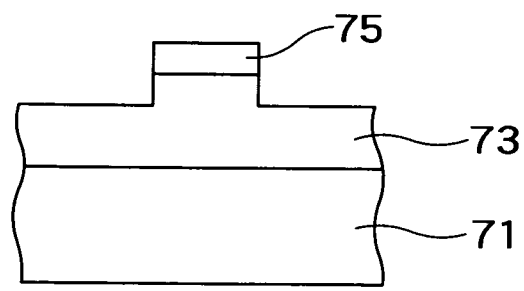
FIG. 16 is a view showing a state where the coating type silicon oxide film is used as a mask to process an organic material film.
Figure 17:
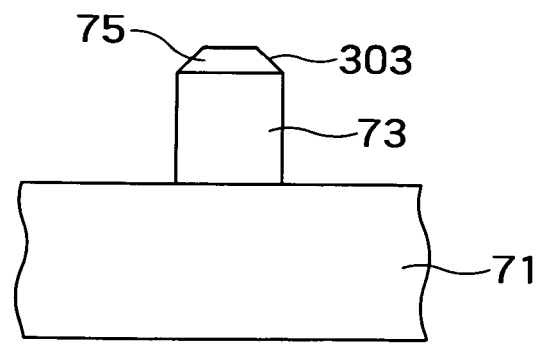
FIG. 17 is a view showing a shoulder damage that has occurred in a coating type silicon oxide film due to collective processing according to a conventional technology.
Figure 18:
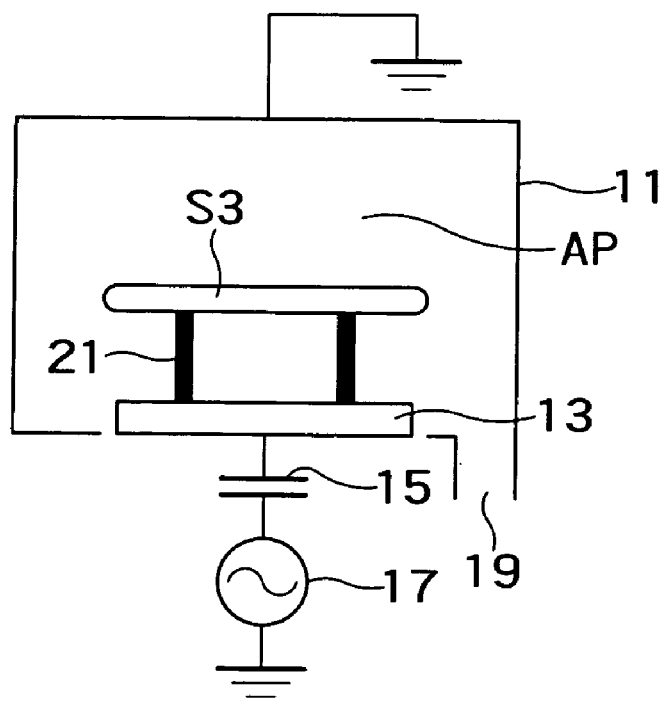
FIG. 18 is a view showing a step of continuing dry etching using the oxygen ($O_2$) gas to remove the organic material film while keeping the pusher pins in a raised state.

Then, as shown in FIG. 14, the processing target substrate S3 is lifted up from a substrate mounting stage 13 by utilizing pusher pins 21 to generate a plasma using an oxygen ($O_2$) gas. As a result, the deposition DF on the inner wall of the vacuum reaction chamber 11 is removed, and dry etching processing is carried out with respect to the processing target substrate S3. Consequently, as shown in FIG. 15, the resist material 79 on the processing target substrate S3 is removed, the coating type silicon oxide film 75 is exposed to the plasma, and this is used as a mask to proceed processing of the organic material film 73 as shown in FIG. 16. The dry etching processing at this step corresponds to, e.g., second dry etching processing in this embodiment. At this time, a potential that functions with respect to pulling the ion into the processing target substrate S3 is reduced based on the above-explained principle (see the respective graphs in FIGS. 1 and 2), and a shoulder damage (see reference numeral 303 in FIG. 17) of the coating type silicon oxide film 75 that occurs in, e.g., the conventional technology does not occur.

Figure 19:
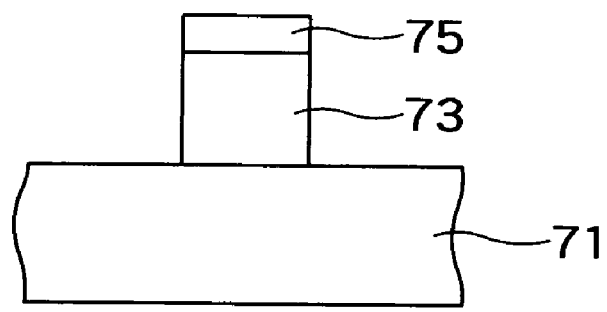
FIG. 19 is a view showing a state where dry etching using the oxygen ($O_2$) gas is continued to remove the organic material film with the pusher pins being kept in a raised state or the pusher pins being set in an original position.

When the organic material film 73 remains at a position except a region covered with the coating type silicon oxide film 75 at a stage where the deposition DF on the inner wall of the vacuum reaction chamber 11 is removed as depicted in, e.g., FIG. 16, dry etching using the oxygen ($O_2$) gas is continued while keeping the raised pusher pins 21, and the coating type silicon oxide film 75 is used as a mask to remove the organic material film 73. Alternatively, when the pusher pins 21 are moved down to return the processing target substrate S3 to the substrate mounting stage 13 while considering the fact that the deposition DF on the inner wall of the vacuum reaction chamber 11 is removed and the organic material film 73 is removed in a state where a larger potential difference for pulling the ion into the processing target substrate S3 is generated, further effective processing can be performed. The dry etching processing at this moment corresponds to, e.g., third dry etching processing in this embodiment. A shoulder damage of the silicon oxide film 75 does not occur as shown in FIG. 19 in both cases where the processing is continued while keeping the raised pusher pins 21 and where the pusher pins 21 are moved down and the organic material film 73 is removed in a state where a larger potential difference is generated. At this time, the end point where the deposition on the inner wall of the vacuum reaction chamber 11 is removed may be detected in the same manner as that of the first embodiment.

Although the silicon substrate 71 is an underlying material of the organic material film 73 in this embodiment, a material that is processed with the organic material film 73 being used as a mask, e.g., a silicon oxide film or a silicon nitride film can be preferably applied irrespective of a type of the pattern. Further, like the first embodiment, various modifications, e.g., adopting a multi-step process or changing a gas type or parameter can be carried out.

(4) Third Embodiment

Figure 20:
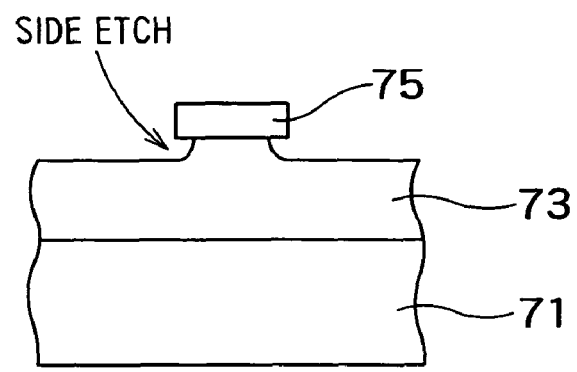
FIG. 20 is a view for explaining a problem that can occur when the first or second embodiment is applied to a substrate having an SMAP structure.

When a substrate having the SMAP structure is subjected to collective processing explained in the first or second embodiment, since a bias voltage may not be substantially applied to the substrate in a dry etching processing carried together with the removal the deposition on the inner wall of the vacuum reaction chamber, an organic material film in a lower layer is isotropically etched to be removed, and side etching may possibly occur as shown in FIG. 20.

This embodiment provides a method of collectively processing a substrate having the SMAP structure without provoking side etching, and is characterized by readily producing a state where a very small bias is applied to a processing target substrate without adopting an operation of moving up pusher pins.

Figure 21:
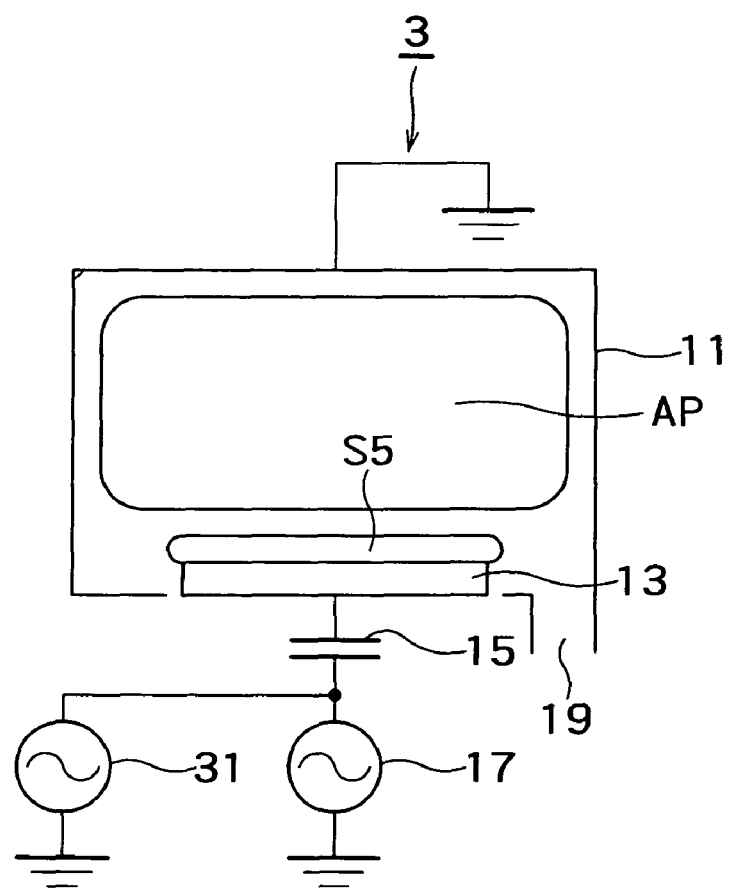
FIG. 21 is a schematic view of a dry etching unit for use in a manufacturing method of a semiconductor device according to a third embodiment of the present invention.

FIG. 21 shows an example of a dry etching unit for use in the manufacturing method according to this embodiment. A dry etching unit 3 depicted in FIG. 21 further comprises a high-frequency power supply 31 which is grounded at one end and connected with a blocking capacitor 15 at the other end in addition to the structure of the dry etching unit 1 depicted in FIG. 1.

Figure 22:
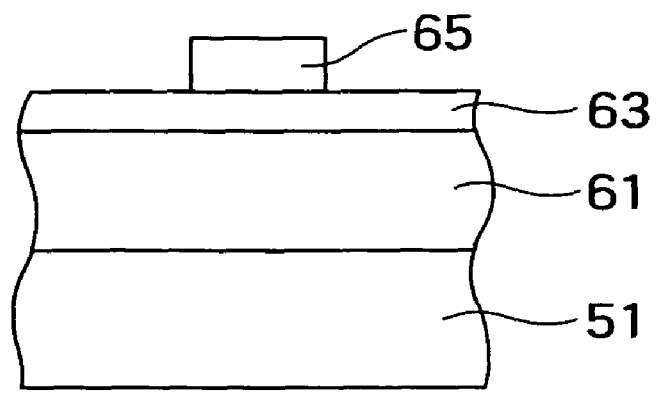
FIG. 22 is a view showing a cross-sectional structure of a processing target substrate in the third embodiment.

FIG. 22 shows a cross-sectional structure of a processing target substrate S5 in this embodiment. An organic material film 61 and a coating type silicon oxide film 63 are deposited on a silicon substrate 51 including a semiconductor device (not shown) formed in a surface layer, and a resist film 65 applied to an upper side of this silicon oxide film 63 is patterned based on a lithography technology.

Figure 23:
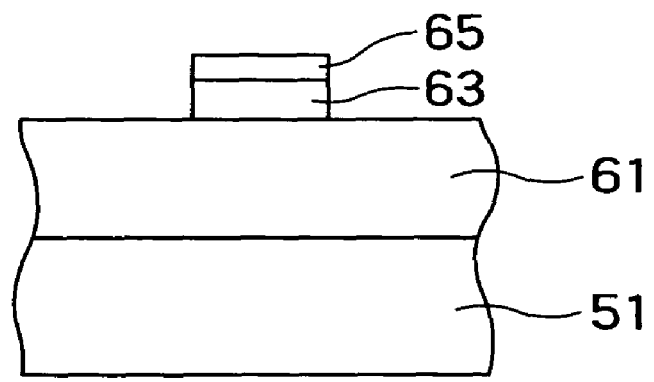
FIGS. 23 to 25 are views for explaining the manufacturing method of a semiconductor device according to the third embodiment of the present invention.
Figure 24:
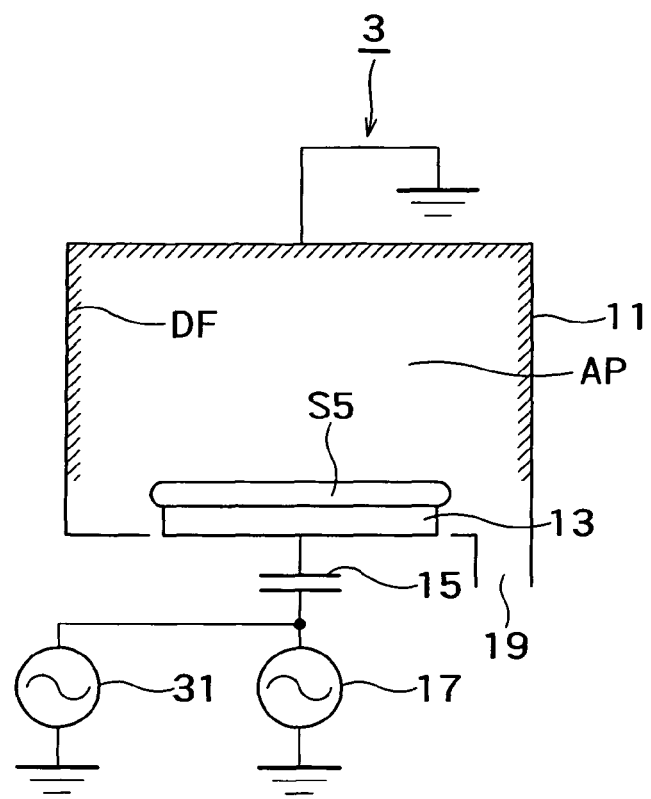

Here, a mixed gas containing a methane trifluoride ($CHF_3$), oxygen ($O_2$) and argon (Ar) is introduced from an upper surface of a vacuum reaction chamber 11 of the dry etching unit 3 depicted in FIG. 21 through a non-illustrated gas introduction opening, a high-frequency power is applied by a high-frequency power supply 17 and the high-frequency power supply 31 to generate a high-frequency plasma in a plasma forming region AP, and a self-bias that is produced due to presence of the blocking capacitor 15 is utilized to pull an ion in the plasma into the processing target substrate S5. Consequently, as shown in FIG. 23, the resist film 65 79 is used as a mask material to process the coating type silicon oxide film 63. The dry etching processing at this step corresponds to, e.g., first dry etching processing in this embodiment. Furthermore, in this embodiment, the mixed gas containing a methane trifluoride ($CHF_3$), oxygen ($O_2$) and argon (Ar) corresponds to, e.g., a first gas. Here, 3.2 MHz is set as a frequency of the high-frequency power supply 17, 100 MHz is set as a frequency of the high-frequency power supply 31, a high-frequency power of approximately 500 W/approximately 1000 W is applied to each frequency 3.2 MHz/100 MHz when processing the coating type silicon oxide film 63, and a pressure is controlled to approximately 50 mTorr. FIG. 24 shows a state of the dry etching unit 3 which has been through this step. As shown in FIG. 24, a fluorocarbon-based deposition DF has adhered to an inner wall of the vacuum reaction chamber 11. It is to be noted that 3.2 MHz corresponds to, e.g., a first frequency and 100 MHz corresponds to, e.g., a second frequency in this embodiment.

Subsequently, an oxygen ($O_2$) gas is introduced from a non-illustrated gas introduction opening, and a pressure is controlled to be, e.g., less than 1 Torr to apply a high-frequency power of approximately 2000 W having a frequency of 100 MHz to the processing target substrate S5 from the high-frequency power supply 31. Any gas capable of removing the fluorocarbon film can be used such as a hydrogen ($H_2$) gas, a nitrogen ($N_2$) gas, an ammonia ($NH_3$) gas, or a mixed gas containing these gases. In this embodiment, the oxygen ($O_2$) gas corresponds to, e.g., a second gas. Here, a power having a frequency of 3.2 MHz from the high-frequency power supply 14 is not applied to the processing target substrate S5.

Figure 25:
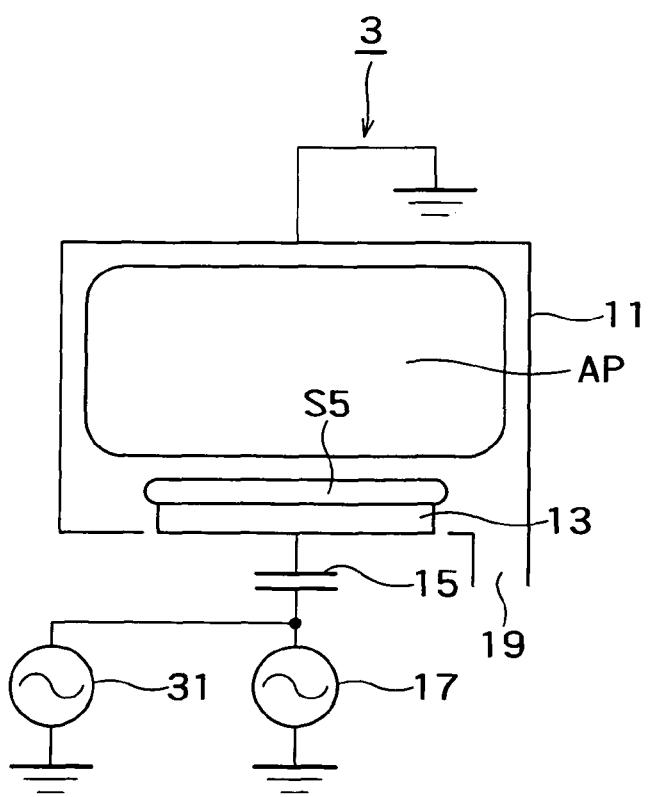
Figure 26:
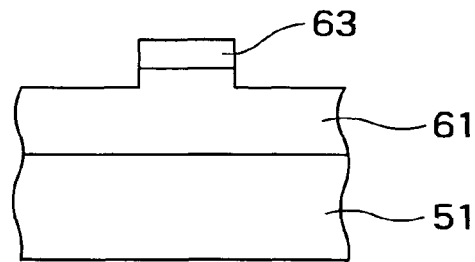
FIG. 26 is a view for explaining the manufacturing method of a semiconductor device according to the third embodiment of the present invention.
Figure 27:
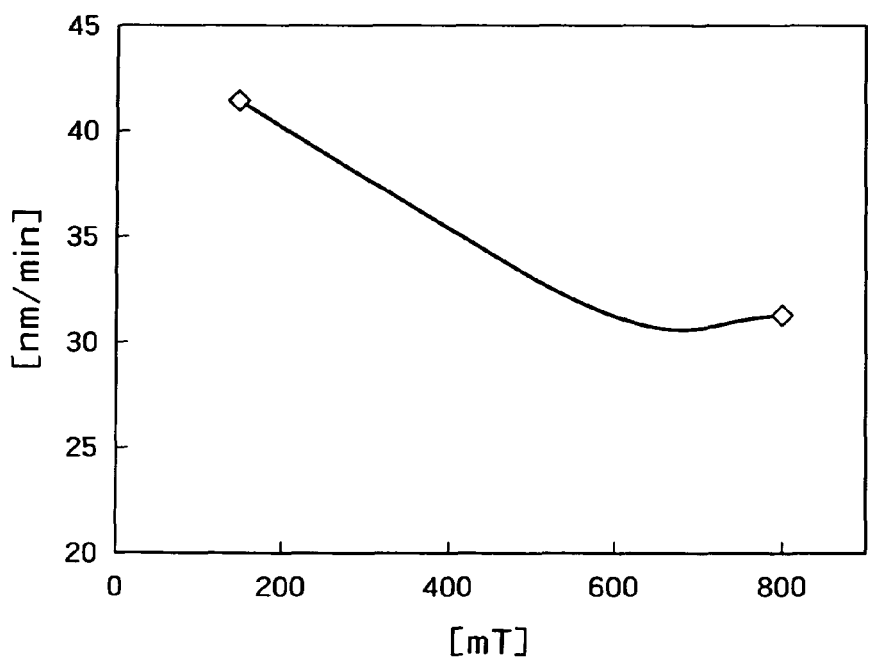
FIG. 27 is a graph showing a relationship between a processing pressure and an etching rate of a silicon oxide film.
Figure 28:
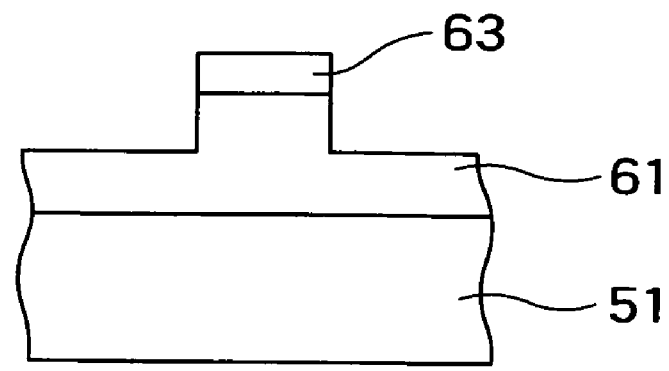
FIGS. 28 and 29 are views for explaining the manufacturing method of a semiconductor device according to the third embodiment of the present invention.
Figure 29:
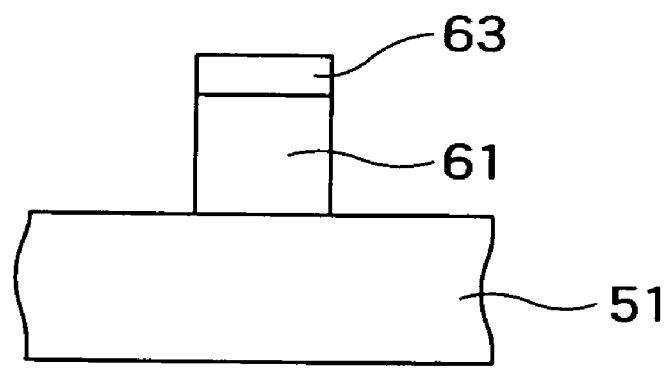

When the high-frequency power of approximately 100 MHz alone is applied under a high pressure in this manner, the fluorocarbon-based deposition DF is removed from the inner wall of the vacuum reaction chamber 11 as shown in FIG. 25. Moreover, at this time, as shown in FIG. 26, the resist film 65 of the processing target substrate S5 is simultaneously removed, and the coating type silicon oxide film 63 is exposed to the plasma. As a result, processing of the organic material film 61 advances with the coating type silicon oxide film 63 being used as a mask as depicted in FIG. 28. However, since a self-bias voltage that functions to pulling an ion into the processing target substrate S5 is reduced to several-ten V in the case when the high-frequency power of approximately 100 MHz or more alone is applied to the substrate mounting stage 13 under a high pressure, a shoulder damage of the coating type silicon oxide film 63 that occurs in the conventional technology is not produced. Additionally, since etching processing advance with anisotropy when the weak self-bias voltage of several-ten V is applied to the processing target substrate S5, such side etching of the organic material film 61 as shown in, e.g., FIG. 20 can be suppressed. The dry etching processing at this step corresponds to, e.g., second dry etching processing in this embodiment. A graph of FIG. 27 shows a relationship between a processing pressure and an etching rate of the silicon oxide film when a oxygen ($O_2$) gas and a methane trifluoride ($CHF_3$) gas are mixed by the flow ratio of about 20:1 and the processing pressure thereof is fluctuated from 150 mTorr to 800 mTorr in order to simulate a state where a fluorocarbon-based component is supplied from the deposition on the inner wall of the reaction chamber upon generation of a plasma using an oxygen ($O_2$) gas. It can be understood from FIG. 27 that approximately 500 mTorr or more is desirable as a pressure in the etching processing at this time in order to suppress a shoulder damage of the coating type silicon oxide film 63.

As explained above, after the fluorocarbon-based deposition DF has been removed from the inner wall of the vacuum reaction chamber 11, a mixed gas containing, e.g., oxygen ($O_2$) and a carbon monoxide (CO) is introduced to control a pressure to, e.g., approximately 20 mTorr, a high-frequency power of approximately 2000 W having a frequency of 100 MHz is applied to the processing target substrate S5 from the high-frequency power supply 31, and a high-frequency power of approximately 500 W having a frequency of 3.2 MHz is applied to the same from the high-frequency power supply 17. At this time, the end point where the deposition on the inner wall of the vacuum reaction chamber 11 is removed may be detected in the same manner as that of the first embodiment. Here, in the condition that the fluorocarbon-based deposition DF has been removed from the inner wall of the vacuum reaction chamber 11, the high-frequency power from both of the high-frequency power supply 17 and the high-frequency power supply 31 is again applied under a low pressure of, e.g., approximately 5 to 50 mTorr to increase the bias for the processing target substrate S5, thereby vertically processing the organic material film 61 at a high etching rate without a shoulder damage of the coating type silicon oxide film 63. The dry etching processing at this step corresponds to, e.g., third dry etching processing in this embodiment. Moreover, in this embodiment, the mixed gas of oxygen ($O_2$) and a carbon monoxide (CO) corresponds to, e.g., a third gas, but another fluorine-free gas (a gas that does not contain fluorine) can be substituted in the third dry etching processing. Furthermore, although the silicon substrate 51 is an underlying material of the organic material film 61 in this embodiment, a material that is processed with the organic material film 61 being used as a mask, e.g., a silicon oxide film or a silicon nitride film can be preferably applied irrespectively of a type of the pattern.

The invention claimed is:

1. A manufacturing method of a semiconductor device using a semiconductor manufacturing unit comprising a reaction chamber, a substrate mounting stage, a high frequency power supply coupled to the substrate mounting stage, a blocking capacitor interposed between the substrate mounting stage and the high-frequency power supply, and a temporary support member for a substrate to continuously perform a plurality of dry etching processing with respect to the same substrate in the same reaction chamber, the method comprising:

disposing a substrate on a substrate mounting stage, and applying high-frequency power to the substrate mounting stage, thereby generating a bias voltage to the substrate while introducing a fluorocarbon-based first gas to perform a first dry etching processing with respect to the substrate; and separating the substrate from the substrate mounting stage by using the temporary support member after the first dry etching processing, and applying the high-frequency power to the substrate mounting stage while introducing a second gas to remove a fluorocarbon-based deposition in the reaction chamber and perform a second dry etching processing with respect to the substrate.

2. The manufacturing method of a semiconductor device according to claim 1, further comprising:

again disposing the substrate on the substrate mounting stage by using the temporary support member after removal of the deposition to perform a third dry etching processing.

3. The manufacturing method of a semiconductor device according to claim 2, wherein the third dry etching processing is carried out by using a third gas different from the second gas.

4. The manufacturing method of a semiconductor device according to claim 1, wherein a surface of the temporary support member is coated with an insulating film.

5. The manufacturing method of a semiconductor device according to claim 4, wherein the insulating film is formed of ceramics.

6. The manufacturing method of a semiconductor device according to claim 4, wherein the insulating film is formed of one of an aluminum oxide ($Al_2O_3$) and an yttrium oxide ($Y_2O_3$).

7. The manufacturing method of a semiconductor device according to claim 1, wherein the second dry etching processing includes detecting an end point of removal of the deposition.

8. The manufacturing method of a semiconductor device according to claim 2, wherein the third dry etching processing is performed under a pressure lower than a processing pressure at the second dry etching.

9. The manufacturing method of a semiconductor device according to claim 1, wherein the second gas includes at least one of oxygen, hydrogen, nitrogen and ammonia.

* * * * *